US008633472B2

(12) United States Patent
Boulaevskii et al.

(10) Patent No.: US 8,633,472 B2
(45) Date of Patent: Jan. 21, 2014

(54) TUNABLE TERAHERTZ RADIATION SOURCE

(75) Inventors: Lev Boulaevskii, Los Alamos, NM (US); David M. Feldmann, Los Alamos, NM (US); Quanxi Jia, Los Alamos, NM (US); Alexei Koshelev, Bolingbrook, IL (US); Nathan A. Moody, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 451 days.

(21) Appl. No.: 12/541,073

(22) Filed: Sep. 14, 2009

(65) Prior Publication Data

US 2011/0062423 A1 Mar. 17, 2011

(51) Int. Cl.
*H01L 27/18* (2006.01)
(52) U.S. Cl.
USPC ............. 257/31; 505/100; 505/110; 505/120; 505/121; 505/125; 505/180; 505/181; 505/190; 505/329
(58) Field of Classification Search
USPC .................................... 505/121, 125; 257/31
See application file for complete search history.

(56) References Cited

U.S. PATENT DOCUMENTS

| 5,250,817 | A | * | 10/1993 | Fink ............................... 505/190 |
| 6,144,679 | A | | 11/2000 | Herman et al. |
| 7,610,071 | B2 | | 10/2009 | Welp et al. |
| 2001/0035524 | A1 | | 11/2001 | Zehe |
| 2004/0149983 | A1 | * | 8/2004 | Lee et al. ........................ 257/31 |
| 2009/0197770 | A1 | | 8/2009 | Endo |

OTHER PUBLICATIONS

L.N. Bulaevskii et al., "Radiation Due to Josephson Oscillations in Layered Superconductors", Physical Review Letters, vol. 99, Aug. 2007, pp. 057002-1-057002-4.
Written Opinion of the International Searching Authority, Int'l App. No. PCT/US10/02217, dated Sep. 30, 2010.

* cited by examiner

*Primary Examiner* — Fei Fei Yeung Lopez
(74) *Attorney, Agent, or Firm* — Ryan B. Kennedy

(57) ABSTRACT

Terahertz radiation source and method of producing terahertz radiation, said source comprising a junction stack, said junction stack comprising a crystalline material comprising a plurality of self-synchronized intrinsic Josephson junctions; an electrically conductive material in contact with two opposing sides of said crystalline material; and a substrate layer disposed upon at least a portion of both the crystalline material and the electrically-conductive material, wherein the crystalline material has a c-axis which is parallel to the substrate layer, and wherein the source emits at least 1 mW of power.

20 Claims, 2 Drawing Sheets

TUNABLE TERAHERTZ RADIATION SOURCE

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD OF THE INVENTION

The present invention relates to a compact, tunable, solid-state wave source of THz radiation comprising a plurality of intrinsic Josephson junctions.

BACKGROUND OF THE INVENTION

The portion of the electromagnetic spectrum ranging from about 0.3 THz to about 5 THz is often referred to as "the THz gap," which reflects the fact that there are essentially no practical sources to produce continuous, tunable, narrowband radiation in this range. Despite over a decade of intense effort, the well-established emission techniques that have proven useful for the neighboring regions of the spectrum have proven ineffective for the THz band. However, this spectral region, because of its unique propagation characteristics and interaction with matter, holds the potential for exciting applications. Terahertz waves usually travel in line of sight. The radiation is non-ionizing, submillimeter microwave radiation and, like microwaves, has the capability to penetrate a wide variety of non-conducting materials. Terahertz radiation can pass through, for example, clothing, paper, cardboard, wood, masonry, plastic and ceramics. It can also penetrate fog and clouds, but does not penetrate metal or water. The Earth's atmosphere is a strong absorber of terahertz radiation which presents both advantages and challenges to its utilization.

A number of attempts have been made to produce practical and economically viable THz sources. Vacuum electronic devices, such as backward wave oscillators (BWOs), provide milliwatts of tunable power at high efficiency, but are not practical for portable applications due to their large size (and their need for a high-voltage supply and an external magnetic field). Despite their promise of high power, the same is true of all devices based on modulation of a high energy electron beam: their essential component is a large electron beam accelerator which cannot be made portable or lightweight with today's accelerator technologies. Quantum cascade lasers (QCL) have recently emerged as a new THz source, but these require complicated fabrication of quantum wells, and suffer from high power consumption, short lifetime (several hundred hours), and very low efficiency. Harmonic THz generation using microwave sources is a commercially available technology, but limited tunability and low efficiency remain a problem due to losses associated with harmonic conversion. In light of these limitations, Josephson junctions are a compelling alternative.

A Josephson junction is essentially two superconductors separated by a very thin insulating layer. A DC voltage applied across a properly designed junction causes it to oscillate and emit (or interact with) electromagnetic radiation. The emitted frequency is proportional to the applied voltage, up to a limit set by the superconducting energy gap. Investigation of Josephson Junctions as high frequency RF sources began as early as 1994, with the fabrication of an array that successfully functioned in the super-radiation regime at GHz frequencies. The total output power was about 10 μW and was delivered to a load rather than emitted into free space and detected as radiation. This effort involved using artificial Josephson Junctions (AJJs), which have several disadvantages. Because artificial junctions contain an amorphous insulating layer separating the superconducting layers, the crystalline properties of each layer can vary, causing each junction to emit at a different frequency. Furthermore, the small superconducting energy gap associated with AJJs limits the upper operating frequency to less than 1 THz and the large junction dimensions require that they be spaced 1 radiation wavelength apart in order to emit with the same phase. Such an arrangement limits emission to only discrete frequencies (i.e., limited tunability) and severely limits total output power, as power is proportional to the square of the total number of junctions. More recent efforts using Josephson Junctions has focused on establishing a "driven vortex lattice" in the superconducting material which, at the surface, creates an oscillating magnetic field. Metallic structures, such as Bragg gratings, are then placed on the surface causing the vortex lattice's field to radiate into free space. This approach does not create a laser-like interaction among Josephson junctions and is severely limited, therefore, in terms of output power, bandwidth, and tunability.

There exists a continuing need, therefore, for a THz radiation source that has increased and scalable output power, spans the broad range of THz radiation, is tunable to essentially any frequency within this range, and which is commercially viable.

SUMMARY OF THE INVENTION

The present invention meets the aforementioned need by providing a THz source comprising a plurality of intrinsic (as opposed to artificial) Josephson Junctions ("IJJs"). Whereas a single junction emits miniscule power, it has been discovered that, if many IJJs are co-located within a radiation wavelength, the IJJs may be synchronized in terms of the phase of their respective oscillation so that the total power emitted is proportional to the square of the number of junctions. This novel approach allows individual junctions to interact with one another so as to produce stimulated emission, similar to the behavior of atomic oscillators in a laser. Under these conditions, it is possible to generate useful amounts of THz radiation on the order milliwatts from a single stack comprising IJJs, scalable to about 1 W for an phased-array configuration of junction stacks, as opposed to <10 μW as in previous attempts.

Key to this approach is the use of a suitable superconducting material that can be fabricated in such a manner that the final product comprises "stacks" comprising IJJs (FIG. 1). One example of a suitable material is $Bi_2Sr_2CaCu_2O_8$ ("BSCCO"). This material has an energy band gap of approximately 60 meV, which allows RF emission to be tuned to THz wavelengths. Multiple junction stacks comprising IJJs can be coupled together in-phase, which increases the total power output. The superconducting material comprising the IJJs can further be fabricated into devices having a moderate heat load and small size. This allows for easy portability and cooling to below liquid nitrogen temperatures using compact, commercially-available cryogenic coolers. An additional and crucial advantage is that the device requires no external magnetic field, Bragg structures, or other external influence to excite or control THz emission.

Previous attempts to exploit IJJs as efficient THz emitters include the creation of vortex lattices whose motion gives rise to emission of electromagnetic waves. The emission depends upon external stimuli such as a magnetic field and depends upon a cavity resonance to achieve coherent interaction among the individual IJJ junctions. The present invention represents a fundamentally different approach, and is derived from first principles. Previously, it has not been understood that IJJ self-synchronization, the process by which individual junctions or emitters spontaneously lock into an identical phase of oscillation, can be achieved solely through the radiation field of the emitters themselves. The radiation shields of the present invention take advantage of this effect by preventing cancellation of field components which are out of phase with each other.

The following describe some non-limiting aspects of the present invention.

According to one embodiment of the present invention, a terahertz radiation source is provided comprising a junction stack, said junction stack comprising a crystalline material comprising a plurality of self-synchronized intrinsic Josephson junctions; an electrically conductive material in contact with two opposing sides of said crystalline material; and a substrate layer disposed upon at least a portion of both the crystalline material and the electrically-conductive material, wherein the crystalline material has a c-axis which is parallel to the substrate layer, and wherein the source emits at least 1 mW of power.

According to yet another embodiment of the present invention, a method of producing terahertz radiation is provided, comprising providing a junction stack comprising a crystalline material, said crystalline material comprising a plurality of self-synchronized intrinsic Josephson junctions; placing the opposing sides of the crystalline material in contact with an electrically conductive material; placing the crystalline material and the electrically-conductive material on a substrate layer, such that the c-axis of the crystalline material is parallel to the substrate layer; and, supplying a bias current to the electrically conductive material.

DETAILED DESCRIPTION OF THE INVENTION

Figure 1:
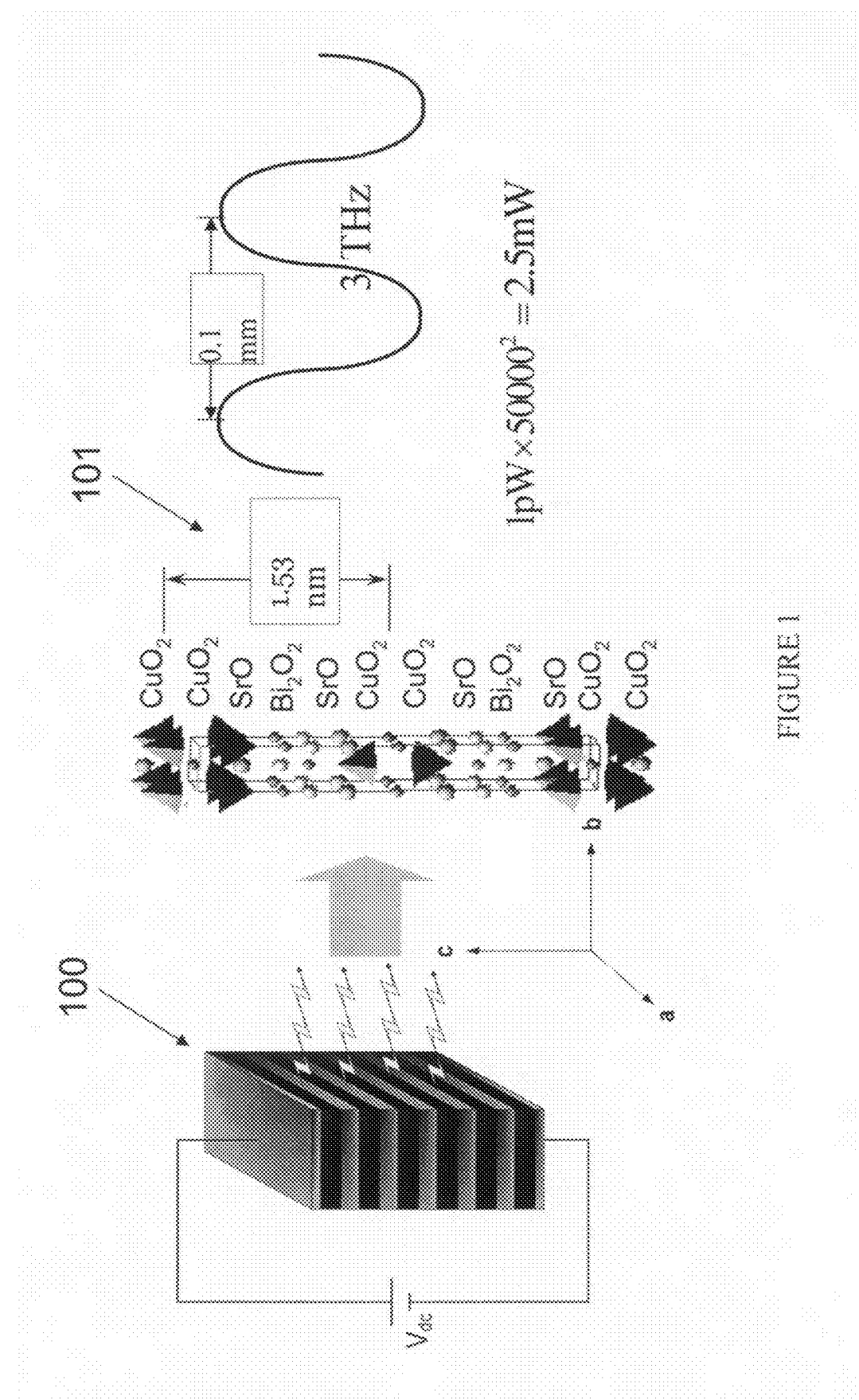
FIG. 1 depicts a crystalline material, BSSCO, comprising IJJs.

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

"Terahertz (or THz) radiation," as used herein, refers to electromagnetic waves at frequencies in the terahertz ($10^{12}$ Hz) range, and is understood to encompass the region of the electromagnetic spectrum between 300 gigahertz ($3\times10^{11}$ Hz) and 3 terahertz ($3\times10^{12}$ Hz), corresponding to the sub-millimeter wavelength range between 1 millimeter (high-frequency edge of the microwave band) and 100 micrometer (long-wavelength edge of far-infrared light).

"Intrinsic Josephson Junction," or IJJ, as used herein, is understood to mean Josephson Junctions which are formed as a result of the arrangement of planes of molecules within the unit cell of a superconducting compound. IJJs are understood not to include artificial Josephson Junctions, in which each junction is fabricated separately and from different materials, and is formed by placing an insulating layer between two superconducting layers.

"Self-synchronized," as used herein, refers to the process by which multiple emitters in close proximity to one another spontaneously transition from emitting individual radiation fields of disparate phase to a state where each phase of oscillation is identical among emitters such that a single radiation field results whose power is proportional to the square of the number of participating junctions.

"Scalable power," as used herein, means that a plurality of junction stacks (or "stacks"), when arranged in a phased-array configuration, has the capability to achieve higher radiated power than is emitted from a single junction stack. By arranging two or more junction stacks together, in the manner described below as a phased-array configuration, their total power can be combined to enable exponentially higher collective power from the ensemble of stacks than from any one stack alone.

A phased-array configuration of stacks may be achieved when multiple junction stacks are arranged in a two dimensional periodic grid of finite extent with weak RF coupling between each stack and its nearest neighbor. The mechanism of achieving the weak coupling required for phased arrays of junction stacks include 1) locating each stack in close proximity, as would be understood by one of skill in the art, to its nearest neighbor such that the radiation fields overlap to create the required coupling and 2) making provisions for a strip-line wire (consisting of metal and silicon) to pass underneath or near each IJJ stack on the phased array grid, providing weak RF coupling among sources.

Intrinsic Josephson Junctions

The present invention comprises an arrangement of IJJs, evaluated in theory only in L. N. Bulaevskii et al., "Radiation due to Josephson Oscillations in Layered Superconductors," Phys. Rev. Lett. 99, 057002 (2007), incorporated herein by reference in its entirety. Rather than separately fabricating each layer, as in AJJs, the present invention utilizes a high temperature superconducting material in which the IJJs result from the crystalline lattice structure of the material. This enables the requisite packing density such that many thousands of junctions can be co-located in the space of a single radiation wavelength (a requirement for self-synchronization). When a DC voltage (FIG. 1, 100) is applied across the stack, THz emission is generated when the correct orientation and dimensions of the layers are present, as described herein. The amplitude of emission depends upon the number of junctions interacting with the radiation field and the frequency depends upon the value of the DC voltage drop across each junction (or total current through the entire stack). Without wishing to be limited by theory, the fact that IJJ radiated power is proportional to the square of the number of active junctions is a consequence of self-synchronization, as this is a signature of coherence among a system of harmonic oscillators. This interaction is achieved only when the junctions are forced from a superconducting state to a normal state, such that a voltage drop appears across each junction causing the phase of the tunneling current to oscillate. For a high purity crystal, the individual junctions are identical and electrically in series with one another; therefore, the same voltage drop occurs across each (with the exception, perhaps, of the outermost layers), causing each IJJ to emit at the same frequency. The coherent state of emission is preserved not just for a single frequency (as would be the case if a resonant cavity field were responsible for self-synchronization) but for a large span of frequencies extending from approximately 0.5 to 7 THz. The analogous situation in a solid-state laser would be the ability to tune the band-gap of the lasing material, resulting in a corresponding change in output frequency.

One example of a suitable high temperature superconducting material is $Bi_2Sr_2CaCu_2O_8$, or BSSCO. FIG. 1 schematically depicts BSSCO. Referring to FIG. 1, the atomic planes $CuO_2$—$SrO$—$Bi_2O_2$—$SrO$—$CuO_2$ represent a single Josephson junction (101), wherein the cuprate planes function as insulators which enable the tunneling effect upon which Josephson junctions are based. The IJJs of the present invention have a height along the c-axis (see FIG. 1) of about 1.53 nm, and superconducting gap of about 60 meV. The number of IJJs in a stack of the present invention may be from about 500 to about 50,000, alternatively from about 10,000 to about 50,000, and alternatively is about 50,000. When the number of IJJs exceeds about 50,000, the dimensions of the stack may exceed a single wavelength, depending upon the desired frequency range of operation, which in turn may limit tuneability. One example of a suitable high temperature superconducting material is $Bi_2Sr_2CaCu_2O_8$, or BSCCO. FIG. 1 schematically depicts BSCCO.

Other materials besides BSSCO may be used in the present invention, provided the material has similar or identical anisotropy, is a high-temperature superconducting compound that exhibits the requisite high degree of anisotropy while still exhibiting the highly ordered structure at macroscopic length scales. One non-limiting example of a suitable crystalline material is $Tl_2Sr_2CaCu_2O_8$. The thallium-based structure has a larger superconducting energy gap, enabling even higher frequency emission ranging from 10 to several hundred 100 THz. Compounds such as the commonly-used YBCO can be made anisotropic by reducing the oxygen content, but this introduces random disorder in the structure which prevents IJJ formation.

Method of Making

The crystalline material of the present invention can be fabricated using a number of standardized techniques, the most commonly used of which is chemical vapor deposition. These techniques typically yield a crystal whose a-b planes are parallel to the substrate surface, leaving the c-axis perpendicular to the substrate. This arrangement, however, is not compatible with the geometry contemplated in the present invention, which requires the c-axis to be grown parallel to the substrate in order to out-couple radiation and manage the heat load generated during operation. Such techniques have not been demonstrated to date, for two reasons: 1) the natural growth orientation places the c-axis at surface normal, and 2) no application has to date required this orientation. The fabrication method of the present invention utilizes what is termed a buffer layer, which is located either between the BSCCO and the substrate or serves as the substrate itself. In the absence of a buffer layer, BSCCO crystal growth occurs in the manner which minimizes free energy, namely the c-axis surface normal orientation. By using a lattice-matched buffer layer, however, the orientation can be tailored and controlled. In the present invention, SrLaAlO, $NdCaAlO_4$, $NdGaO_3$, or $LaO_3$ buffer layers are either cut or deposited along the (110) plane and then BSCCO is grown on top using the pulsed laser deposition method. Because the buffer layers exhibit the desired orientation, the layer of BSCCO grown on top does as well.

The requisite BSCCO films can be grown on the 110 face of substrates comprising sapphire, diamond, alumina, silicon dioxide, SrLaAlO, $NdCaAlO_4$, $NdGaO_3$, $LaO_3$, or combinations thereof, using a XeCl excimer laser (wavelength 208 nm, energy density at target surface of 2 J/cm^2, and a repetition rate of 10-20 Hz). The pulsed laser impinges upon target materials, which are commercially available in high purity form, resulting in a plume of material which travels toward the substrate and deposits to form a thin film. Depositions are carried out with a substrate-to-target distance of 5 to 10 cm within an oxygen pressure of 200 millitorr. Substrate temperature can vary from 700° C. to 875° C. After deposition, the samples are typically allowed to cool to room temperature in an oxygen atmosphere with pressure of several hundred torr.

This "self-synchronization process" is quite robust to crystalline impurities because individual lattice defects are averaged out since the frequency of oscillation for that local IJJ is dictated by the total voltage drop presented by a series of atomic planes. Thus, one way of quantifying allowable defect density is that crystalline purity must be such that the individual Ws differ one from the other (in terms of c-axis resistivity) by no more than 10%.

Device

Figure 2:
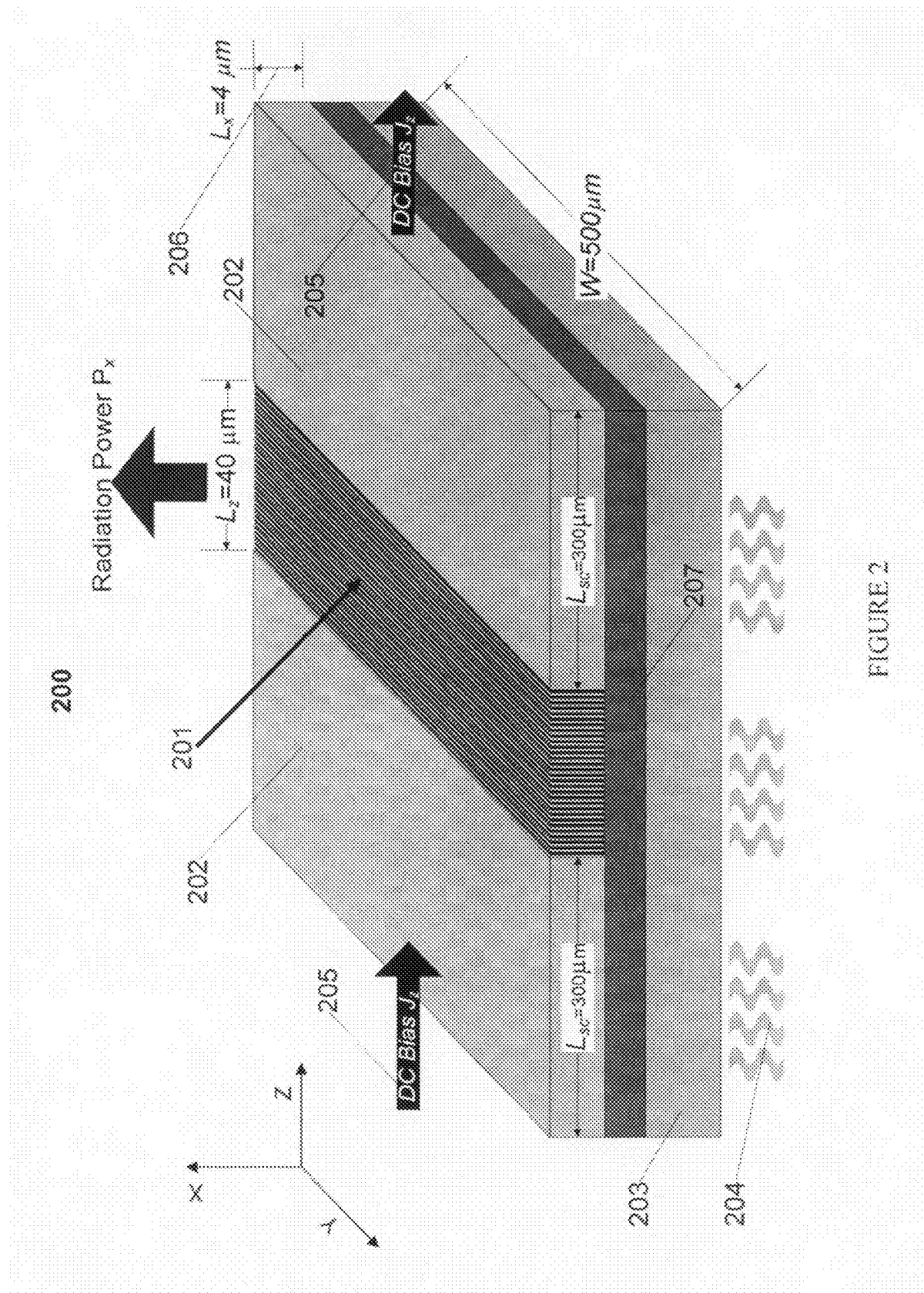
FIG. 2 depicts one example of a junction stack of the present invention, which comprises IJJs. The dimensions are exemplary and non-limiting.

The device of the present invention comprises one or more junction stacks comprising a plurality of Ws situated between plate-like leads, together with appropriate dimensions and orientation with respect to current flow and the Poyting vector. FIG. 2 depicts one non-limiting example of the device (200) of the present invention. Junction stack (200) comprises a plurality of IJJs (201), which are made of a suitable crystalline material and comprises about 50,000 IJJs. The IJJs are connected on both sides (top and bottom in FIG. 1) to an electrically conducting contact (202), which can either directly abut the IJJs or overlap and envelope the edges of the IJJs, provided that the number of un-obstructed junctions between the contacts remains high (from about 10,000 to about 50,000). The IJJs (201) and contacts (202) may, in turn, be in direct and continuous contact with a substrate (203) (not shown). Alternatively, and as depicted in FIG. 2, an IBAD (Ion Beam Assisted Deposition) lattice-matched intermediate buffer layer (207) may be disposed between the substrate (203) and the IJJs (201) and the contacts (202). Alternatively, the aforementioned lattice-matched buffer layers may be used as a substrate.

Nonlimiting examples of suitable substrates include sapphire, diamond, alumina, and other insulators with a similar and sufficient heat capacity. Rejected heat (204) may be radiated through the substrate (203). A DC bias current (205) is applied to the electrically conducting contacts (while the IJJs are in the superconducting state) such that a voltage drop occurs across all IJJs. Because the IJJs are identical and connected in series, the voltage drop across each IJJ in a given stack is the same. The voltage across a given junction is a critical parameter, since it dictates (via the AC Josephson effect) the natural oscillation frequency with a proportionality of 0.485 THz per millivolt. In this manner, the natural oscillation frequency of each IJJ can be varied by adjusting the DC bias current across the entire stack, providing frequency tunability. The voltage range corresponding to THz emission is roughly 1-100 mV. In the device of the present invention the width of the stack is much longer than a radiation wavelength. In the device of the present invention the length of the IJJs (along the y direction in FIG. 2) is much longer than a radiation wavelength (i.e., from about 30 μm to about 300 μm). The IJJs (201) may have a thickness (206) (in the x direction of FIG. 2) from about 1 μm to about 50 μm, and in one embodiment is about 4 μm. In theory, there is no upper limit to the thickness, however, increasing the thickness results in generation of additional heat, which must be dissipated. For this reason, it is beneficial to keep the thickness (206) as thin as practical, depending upon limits set by fabrication. The length in the z direction, as shown in FIG. 2, of the IJJs (201) is the critical dimension which must be less than a radiation wavelength. The electrically conducting contacts (202) serve not only as convenient wire-bond locations, but act as radiation screens, restricting emission to the half-infinite spaces on either side of the device, which in turn greatly enhances emitted radiation by eliminating destructive interference between waves on either side of the crystal. Because heat dissipation increases linearly with junction thickness while output power remains constant, a thin plate-like geometry is desired in order to maximize efficiency.

In one embodiment, the terahertz radiation source comprises a plurality of junction stacks scalable to (capable of emitting) about 1 W in a phased-array configuration. The number of junction stacks may be from about 2 to about 100, and alternatively is about 100.

An important aspect of the present invention is that the THz emission is independent from and does not require the presence of an external field, such as a magnetic or electric field. It is understood that "external field" does not include the DC bias current which initiates and sustains emission. Accordingly, in one embodiment, the device is free from input from an external power source.

Whereas particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A terahertz radiation source comprising a junction stack, said junction stack comprising:
   a substrate layer;
   a crystalline material comprising a plurality of self-synchronized intrinsic Josephson junctions that emit a frequency-tunable terahertz radiation in response to a variable electrical current, the crystalline material defining a c-axis that is parallel to a surface of the substrate layer;
   an electrically conductive material in contact with two opposing sides of said crystalline material; and
   a lattice-matched intermediate layer directly disposed upon the surface of the substrate and upon which both the crystalline material and the electrically conductive material are directly disposed.

2. The terahertz radiation source of claim 1, wherein the source comprises a plurality of junction stacks in a phased-array configuration, wherein the source is capable of emitting about 1 W of power.

3. The terahertz radiation source of claim 2, wherein the phased-array configuration comprises about 100 junction stacks.

4. The terahertz radiation source of claim 1, wherein the source is free from an external magnetic field.

5. The terahertz radiation source of claim 1, wherein the crystalline material comprises from about 500 to about 50,000 intrinsic Josephson junctions.

6. The terahertz radiation source of claim 1, wherein the substrate is selected from the group consisting of diamond, alumina, silicon dioxide, SrLaAlO, NdCaAlO$_4$, NdGaO$_3$, LaO$_3$, and combinations thereof.

7. The terahertz radiation source of claim 1, wherein the crystalline material has a width which is longer than the wavelength of the emitted terahertz radiation.

8. The terahertz radiation source of claim 7, wherein the crystalline material has a length which is less than a radiation wavelength and a thickness of from about 1 µm to about 50 µm.

9. A terahertz radiation source comprising a junction stack, said junction stack comprising:
   a substrate layer;
   a plurality of self-synchronized intrinsic Josephson junctions of a crystalline material defining a c-axis substantially perpendicular to a direction of radiation of the terahertz radiation;
   electrically conducting contacts that are in contact with two opposing sides of said crystalline material, the electrically conducting contacts configured to supply a variable current, the variation of which alters the emission frequency of the terahertz radiation through a predetermined tunable frequency range; and
   a lattice-matched intermediate layer directly interposed between the substrate and both the crystalline material and the electrically conducting contacts, the crystalline layer being arranged on a surface of the substrate such that the c-axis is substantially parallel to the surface of the substrate.

10. A terahertz radiation system comprising:
    a substrate layer;
    a plurality of self-synchronized tunable intrinsic Josephson junctions of a crystalline material comprising a c-axis substantially perpendicular to a direction of radiation of emitted terahertz radiation;
    an electrically conductive material disposed adjacent to and in contact with two opposing sides of said crystalline material such that an imaginary line parallel to the c-axis intersects the electrically conductive layer, the electrically conductive material configured to deliver a variable current to tune the emitted terahertz radiation; and
    a lattice-matched intermediate layer directly interposed between the substrate and both the crystalline material and the electrically conductive material, the crystalline layer being arranged on a surface of the substrate such that the c-axis is substantially parallel to the surface of the substrate.

11. The system of claim 10, wherein the crystalline material comprises Bi$_2$Sr$_2$CaCu$_2$O$_8$.

12. The system of claim 10, wherein the crystalline material comprises Tl$_2$Sr$_2$CaCu$_2$O$_8$.

13. The system of claim 10, wherein the substrate comprises diamond.

14. The system of claim 10, wherein the substrate comprises alumina.

15. The system of claim 10, wherein the substrate comprises silicon dioxide.

16. The system of claim 10, wherein the substrate comprises SrLaAlO.

17. The system of claim 10, wherein the substrate comprises NdCaAlO$_4$.

18. The system of claim 10, wherein the substrate comprises NdGaO$_3$.

19. The system of claim 10, wherein the substrate comprises LaO$_3$.

20. The system of claim 10, wherein the substrate comprises sapphire.

* * * * *